(12) United States Patent
Nanishi et al.

(10) Patent No.: US 6,362,496 B1
(45) Date of Patent: Mar. 26, 2002

(54) SEMICONDUCTOR LIGHT EMITTING DEVICE HAVING A GAN-BASED SEMICONDUCTOR LAYER, METHOD FOR PRODUCING THE SAME AND METHOD FOR FORMING A GAN-BASED SEMICONDUCTOR LAYER

(75) Inventors: Yasushi Nanishi, Otsu; Michio Kadota, Kyoto, both of (JP)

(73) Assignee: Murata Manufacturing Co., Ltd. (JP)

(*) Notice: Subject to any disclaimer, the term of this patent is extended or adjusted under 35 U.S.C. 154(b) by 0 days.

(21) Appl. No.: 09/585,220

(22) Filed: Jun. 1, 2000

Related U.S. Application Data

(62) Division of application No. 09/201,924, filed on Dec. 1, 1998, now Pat. No. 6,146,916.

(30) Foreign Application Priority Data

Dec. 2, 1997 (JP) ................................ 9-331884

(51) Int. Cl.[7] .............................................. H01L 33/00
(52) U.S. Cl. .......................................... 257/94; 257/103
(58) Field of Search .......................... 257/94, 103, 96, 257/97

(56) References Cited

U.S. PATENT DOCUMENTS

| | | | | |
|---|---|---|---|---|
| 4,975,299 A | * | 12/1990 | Mir et al. | 427/51 |
| 5,505,986 A | * | 4/1996 | Velthaus et al. | 427/66 |
| 5,815,520 A | * | 9/1998 | Furushima | 372/45 |
| 6,220,055 B1 | * | 4/2001 | Francel et al. | 65/60.5 |
| 6,288,417 B1 | * | 9/2001 | Nickel et al. | 257/103 |

FOREIGN PATENT DOCUMENTS

| | | |
|---|---|---|
| JP | 5283744 | 10/1993 |
| JP | 8008186 | 1/1996 |
| JP | 8139361 | 5/1996 |
| JP | 9172199 | 6/1997 |
| JP | 9-172199 | * 6/1997 |

* cited by examiner

Primary Examiner—Sara Crane
(74) Attorney, Agent, or Firm—Ostrolenk, Faber, Gerb & Soffen, LLP

(57) ABSTRACT

A method for forming a GaN-based semiconductor layer includes the steps of: forming a ZnO buffer layer on one of a glass substrate and a silicon substrate; and epitaxially growing a GaN-based semiconductor layer on the ZnO buffer layer by using an electron cyclotron resonance-molecular beam-epitaxy (ECR-MBE) method.

5 Claims, 5 Drawing Sheets

SEMICONDUCTOR LIGHT EMITTING DEVICE HAVING A GAN-BASED SEMICONDUCTOR LAYER, METHOD FOR PRODUCING THE SAME AND METHOD FOR FORMING A GAN-BASED SEMICONDUCTOR LAYER

This is a divisional of application Ser. No. 09/201,924, filed Dec. 1, 1998 now U.S. Pat. No. 6,146,916.

BACKGROUND OF THE INVENTION

1. Field of the Invention

The present invention relates to a semiconductor light emitting device, more particularly to a semiconductor light emitting device using a GaN-based material and a method for producing the semiconductor light emitting device. The present invention also relates to a method for forming a GaN based semiconductor layer.

2. Description of the Related Art

GaN has a wide bandgap and light emitting diodes (LEDs) using GaN have been therefore known as semiconductor light emitting devices emitting light in the region from blue to violet. Although semiconductor light emitting devices emitting blue light are prospective key devices in an optoelectronic field, there is a problem that it is very difficult to grow a GaN bulk crystal with high quality. Due to the problem, the research on the growth of GaN bulk crystals deals with the selection of a suitable substrate and on a method for the GaN crystal deposition.

In this connection, a conventional method has tried to use a single-crystal sapphire substrate for depositing the GaN layer thereon by applying the metal-organic chemical vapor deposition method (hereinafter referred to as the "MOCVD method"). In this method, however, a difficulty lies in depositing a GaN layer of high-quality crystallinity. This difficulty is attributed to a great difference between lattice constants of the sapphire substrate and GaN (a particular difference between the lattice constants of the two is as great as about 16.1%), thereby developing crystal defects with a dislocation density as large as $10^8$ to $10^{11}/cm^2$ in the deposited GaN layer.

In recent years, a method has been proposed to cope with problems such as that described above. In the proposed method, a polycrystalline or amorphous crystalline AlN layer is deposited as a buffer layer between a sapphire substrate and a GaN layer in order to reduce the difference between the lattice constants of the single-sapphire substrate and the GaN layer, thereby enabling the deposition of a GaN layer of high-quality crystallinity. It is also disclosed that using a ZnO layer as a buffer layer enables the deposition of the GaN layer on, in addition to the single-crystal substrate, amorphous crystalline substrates such as a quartz glass substrate; and practical applications of this method are being developed (for example, Japanese Unexamined Patent Publication No. 8-139361).

Even in these methods of the related art which form the GaN layer by using a buffer layer, such as an AlN layer or a ZnO layer, on a substrate, the MOCVD method is a mainstream method being used to deposit the GaN layer.

Despite technical development, however, conventional semiconductor light emitting devices have the problems described below.

Specifically, the single-crystal sapphire substrate used hitherto predominantly as a substrate for a GaN layer increases the production costs because the substrate is higher-priced.

In addition, in both of the aforementioned methods of the related art, the MOCVD method is used. In the MOCVD method, however, a substrate needs to be heated to a high temperature of 1,000 to 1,200° C. at the time of vapor deposition to make use of a thermal decomposition reaction for the crystal deposition. Such a high temperature causes the following problems. First, substrates that can be used for depositing a GaN layer thereon are limited to those having a high heat-resisting property. Second, because of the high temperature, a substrate receives a strong effect resulting from a difference between the coefficients of thermal expansion of the substrate and GaN. A particular example is a device in which the GaN layer is deposited on a single-crystal sapphire substrate. In this example, if the substrate on which a GaN layer is deposited at about 1,000° C. is cooled from about 1,000° C. to an ambient temperature, the substrate shrinks greater than the GaN layer due to a difference (about 34%) between coefficients of the single-crystal sapphire substrate and the GaN layer. This often causes distortions, cracks, and lattice defects in the GaN layer, which results in degradation of the crystal quality. As a result, it is difficult to obtain a device having a sufficient light emitting effect.

For the forgoing reasons, there is a need for a semiconductor light emitting device that comprises a GaN-based layer having an excellent crystallinity and a sufficient light emitting effect and that can be produced at a low cost. There is also need for a method for producing the semiconductor light emitting device and a method for forming a GaN-based semiconductor layer having an excellent crystallinity.

SUMMARY OF THE INVENTION

The present invention is directed to a device and a method that satisfies these needs.

The semiconductor light emitting device according to the invention comprises: a glass or silicon substrate having a softening point of 800° C. or less; a ZnO buffer layer provided on the glass substrate; and semiconductor structure including at least one light emitting layer made of a GaN-based semiconductor.

The light emitting layer is preferably formed by using an ECR-MBE method. The semiconductor light emitting device may further comprises an amorphous GaN-based semiconductor buffer layer between the ZnO buffer layer and the light emitting layer. The light emitting layer may be made of GaN semiconductor or InGaN semiconductor.

The method for forming a GaN-based semiconductor layer comprises the steps of: forming a ZnO buffer layer on one of a glass substrate and a silicon substrate; and epitaxially growing a GaN-based semiconductor layer on the ZnO buffer layer by using an electron cyclotron resonance—molecular beam epitaxy (ECR-MBE) method.

The method for producing a semiconductor light emitting device comprises the steps of: forming a ZnO buffer layer on one of a glass substrate and a silicon substrate; and epitaxially growing a light emitting layer made of a GaN-based semiconductor layer on the ZnO buffer layer by using a ECR-MBE method.

These methods may further comprise the step of forming an amorphous GaN-based semiconductor buffer layer on the ZnO buffer layer before the epitaxial growth step.

The epitaxial growth step is preferably performed at a temperature of 850° C. or less and more preferably 700° C. or less. The ZnO layer may be formed on the substrate, and the substrate is made of borosilicate and has a softening point of about 700 to 800° C.

The GaN-based semiconductor layer or the light emitting layer may be a GaN layer or a InGaN layer.

According to the present invention, since an ECR-MBE method is used to form a GaN-based layer, it is possible for nitrogen gas to be supplied in a plasma-state by means of ECR and, by a level that is equivalent to the excitation energy occurring therein, it is possible to lower the substrate temperature.

As a result, lowering the temperature at the time of layer deposition allows the use of materials having low melting points and, accordingly, increases the selection range for the substrate materials. For example, it is difficult to use lower-priced borosilicate glass materials for the substrate in the conventional methods, but it is now possible to use such materials, thereby reducing production costs for the semiconductor light emitting device.

Also, lowering the substrate temperature prevents adverse effects resulting from differences between the thermal expansion coefficients of the substrate and GaN. In addition, in comparison with other materials, GaN and a glass substrate are closer in regard to the thermal expansion coefficient (specifically, the difference between the thermal expansion coefficients of GaN and the glass substrate is about 10%; for reference, the difference between the thermal expansion coefficients of GaN and a sapphire substrate is about 34%.) and have a higher property of ductility, cracks do not occur on the deposited GaN layer, thereby allowing a GaN layer of high quality and having high emission efficiency to be produced.

For the purpose of illustrating the invention, there is shown in the drawings several forms which are presently preferred, it being understood, however, that the invention is not limited to the precise arrangements and instrumentalities shown.

BRIEF DESCRIPTION OF THE DRAWING(S)

DETAILED DESCRIPTION OF PREFERRED EMBODIMENTS

Hereinafter, the preferred embodiments of the present invention are explained in detail with reference to the drawings.

Figure 1:
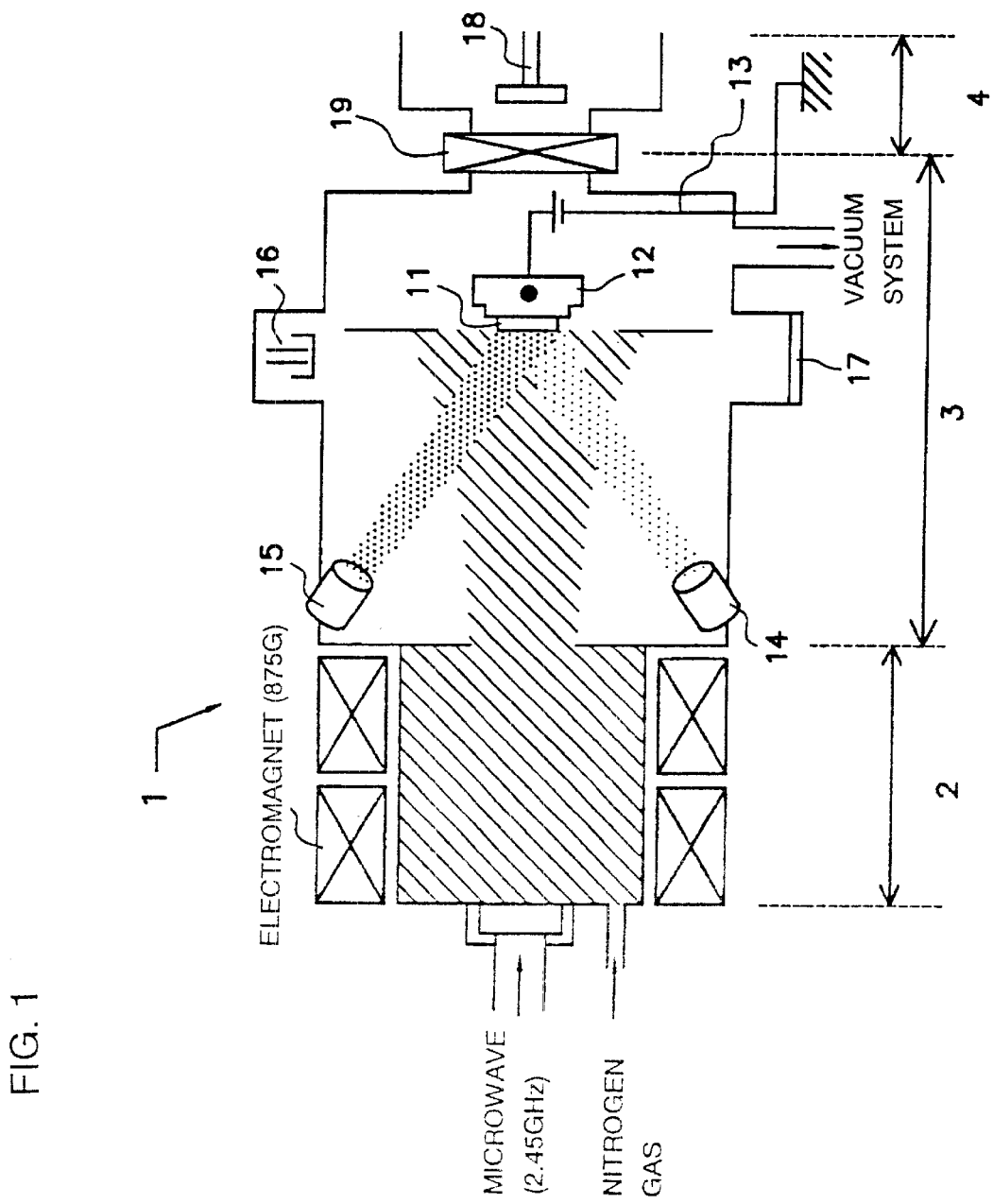
FIG. 1 is a schematic view illustrating an ECR-MBE apparatus used for growing a GaN-based semiconductor layer and for producing a semiconductor light emitting device according to the present invention.

FIG. 1 is a schematic diagram of an ECR-MBE (Electron Cyclotron Resonance—Molecular Beam Epitaxy) apparatus to be used for growing a GaN-based semiconductor layer and producing a semiconductor light emitting device according to the present invention. As this figure shows, the ECR-MBE apparatus comprises three chambers, i.e., a plasma generation chamber 2, a deposition chamber 3, and a substrate exchange chamber 4.

In ECR-MBE apparatus, nitrogen gas is introduced into the plasma generation chamber 2 at a predetermined flow rate by a mass-flow controller (not shown), and a microwave of 2.45 GHz and a magnetic field of 875 G are applied to the introduced nitrogen gas to cause electron cyclotron resonance (ECR), thereby generating plasma. The nitrogen-gas plasma that is generated is then forced by a divergent magnetic field to flow from the plasma generation chamber 2 into the deposition chamber 3.

The deposition chamber 3 comprises a substrate holder 12 with a heater, and a substrate 11 is held by the substrate holder 12. The deposition chamber 3 further comprises a voltage application means 13 for applying a DC bias between a vacuum chamber and the substrate holder 12, which configure the deposition chamber 3. This allows ionized source materials to be effectively fixed on the substrate 11. Concurrently, the collision of unnecessary ions with the substrate 11 is prevented to reduce ion-emission damage, thereby allowing implementation of quality improvement for crystal layers formed on the substrate 11. Also installed therein are a Knudsen cell 14 for supplying a metal Ga as a Ga source and another Knudsen cell 15 for supplying an In metal as an In source. These materials react with plasma-state nitrogen gas arranged to flow in from the plasma generation chamber 2 to form a GaN layer or an InGaN layer on the substrate 11. At this time, since the nitrogen gas is supplied in a plasma state, the temperature of the substrate 11 can be lowered to a level equivalent to excitation energy. As a result, it is possible to epitaxially grow a GaN-based layer at a temperature of 850° C. or less. As an evaluation device of the conditions of a layer on the substrate 11, a RHEED electron gun 16 and a screen device 17 are installed.

In the substrate exchange chamber 4, a substrate-carrying rod 18 for carrying the substrate 11 into the deposition chamber 3 is installed. The substrate-carrying rod 18 is equipped with a heater for preheating the substrate. This rod 18 enables continuous formation of layers on the substrate and reduces the amount of evolving gas that evolves in the preheating of the substrate 11 in the deposition chamber 3.

The deposition chamber 3 and the substrate exchange chamber 4 each have an exhaust system (for example, a turbo molecular pump and a oil rotary pump; not shown) and the two chambers are separated by means of a gate valve 19. This allows the deposition chamber 3 to maintain a minimized content of residual impurity molecules and the increased amount of vacuum air.

First embodiment

Figure 2:
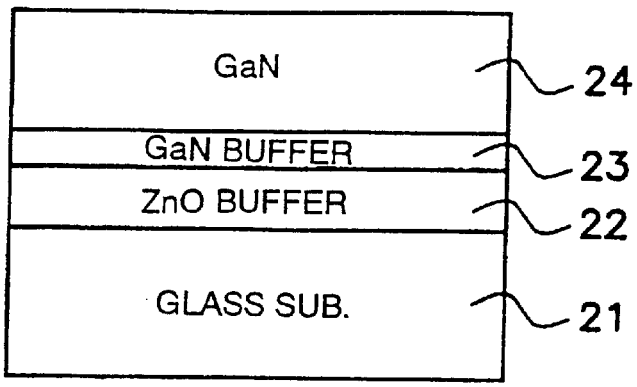
FIG. 2 is a cross-sectional view of a GaN layer grown by a method according to a first embodiment of the present invention.

In this embodiment, as shown in FIG. 2, a GaN layer is formed on a glass substrate by using the ECR-MBE apparatus 1 described above. The following is a description of a substrate, materials, and a procedure which are used in this embodiment.

For a substrate in this embodiment, a low-priced borosilicate glass substrate (hereinafter, simply called glass substrate) 21 is used. The borosilicate glass substrate preferably has a softening point of 800° C. or less and more preferably a softening point within the range of 700 to 800° C. It is understood that the softening point of the glass substrate used in the present invention is at least higher than a maximum temperature to which substrate holder 12 is heated. In this embodiment, a low-priced borosilicate glass having a softening point of about 775° C. is used.

Note that one of the features of the present invention is that the glass substrate having a relatively low softening point can be used as a substrate on which a GaN-based semiconductor layer is epitaxially grown. Generally, the glass substrate having a high softening point is expensive, and a quartz glass substrate having a softening point more than 1000° C. is more expensive. There exists a great variety in terms of a softening point among substrates which are collectively referred as a glass substrate, and the fact that a glass substrate having a low softening point can be employed for epitaxial growth of a GaN-based semiconductor layer brings a great advantage in realizing a commercial mass production of a semiconductor light emitting device emitting blue light.

On this glass substrate 21, using a method, such as an RF magnetron sputtering method, a ZnO buffer layer 22 at a thickness of about 3 μm is deposited. This layer 22 is a polycrystalline layer oriented to the c axis.

The materials used to deposit the GaN layer are a metal Ga of a purity 8N (99.999999%) as a Group III material and nitrogen of a purity 5N as a Group V gas. First, a glass substrate 21 is set onto the substrate-carrying rod 18 of the ECR-MBE device 1. Then, prebaking is performed to eliminate free water and adsorption gas from the glass substrate 21 or the ZnO buffer layer 22. The glass substrate 21 is transferred into the deposition chamber 3, and thermal cleaning at 700° C. is therein performed for the substrate 21 for 30 minutes so that a cleaned surface of a ZnO buffer layer 22 is produced. Then, low-temperature deposition is performed under the conditions of deposition shown in Table 1, for 20 minutes, to grow a GaN buffer layer 23 of about 20 nm in thickness. This buffer layer 23 deposited at a low temperature is amorphous and is intended to improve the crystallinity of a single crystal GaN layer 24 which will be deposited in a later step and may be omitted. The deposition chamber 3 is maintained at about $10^{-7}$ Torr.

TABLE 1

| Substrate Temperature | Ga Cell Temperature | Nitrogen Flow Rate | Microwave Power | Substrate Bias |
|---|---|---|---|---|
| 450° C. | 850° C. | 30 sccm | 80 W | +18 V |

After the buffer layer 23 is deposited at a lower temperature, a GaN layer 24 is epitaxially grown for 120 minutes at a pressure of about $10^{-7}$ Torr under the conditions shown in Table 2.

TABLE 2

| Substrate Temperature | Ga Cell Temperature | Nitrogen Flow Rate | Microwave Power | Substrate Bias |
|---|---|---|---|---|
| 680° C. | 860° C. | 30 sccm | 120 W | +20 V |

Figure 3:
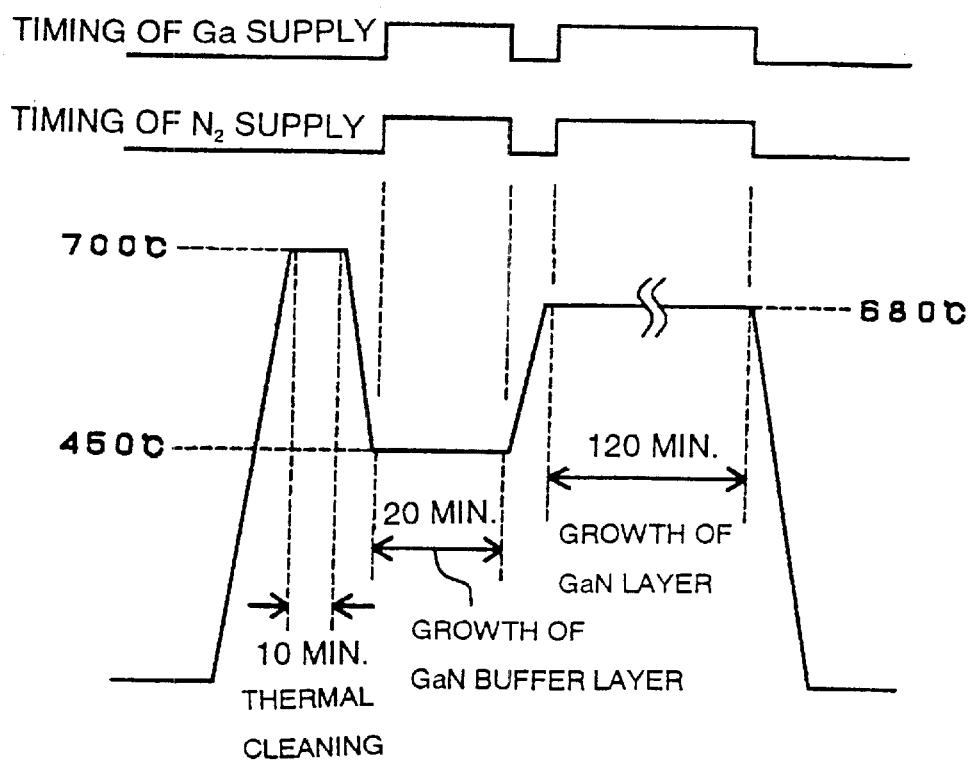
FIG. 3 is a time chart showing a deposition procedure for a GaN layer according to the first embodiment of the present invention.

As a result of carrying out the aforementioned procedure, the layered structure shown in FIG. 2 is produced. A time chart of this deposition procedure for the GaN layer is shown in FIG. 3. As is apparent in FIG. 3, in the series of deposition steps of this embodiment, the substrate temperature can be maintained at 700° C. or lower (although not described above, when the RF magnetron sputtering method is applied, the deposition can be performed at about 200° C.). This allows materials of lower melting point and softening point to be used for the substrate, increasing the selection range for the substrate material. It is very difficult to employ a glass substrate having such a low softening point by a conventional method.

Figure 4:
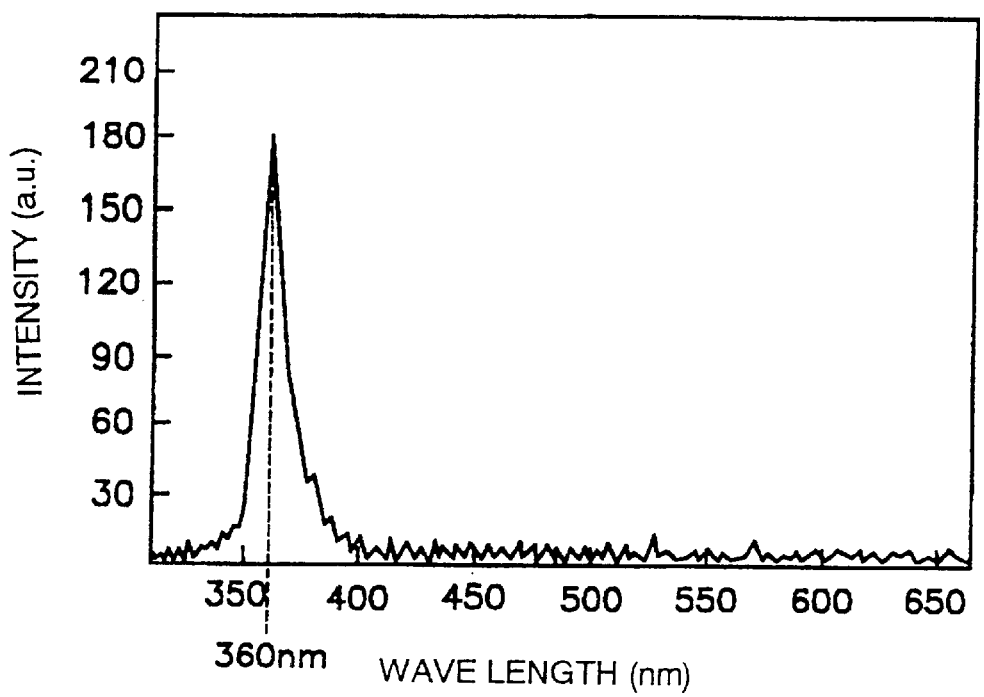
FIG. 4 is a graph showing the photoluminescence spectrum obtained from the GaN layer according to the first embodiment of the present invention.

Optical properties of the GaN layer grown by the aforementioned method will be discussed. As an optical-property evaluation method, a photoluminescence spectrum with an excitation light source of He-Cd laser is measured at a temperature of 77 K or lower. The measurement result is shown in FIG. 4. In FIG. 4, the horizontal axis represents the light emission wavelength λ, and the vertical axis represents the luminous intensity (unit: a.u.). As can be seen from this figure, for the GaN layer produced in this embodiment, an emission spectrum can be confirmed mainly in the vicinity of a band end (360 nm).

According to the inventors' further study, it has been found that ZnO is likely vaporized at a temperature of about 900° C. or more even under a low vacuum condition. It is, therefore, thought that a ZnO buffer layer might disappear during the formation of a GaN layer by a conventional MBE method or CVD method which must employ a temperature of 900° C. or more and it is uncertain that the ZnO buffer layer exists so as to truly act as a buffer layer.

On the contrary, according to the present invention, the substrate temperature during the formation of a GaN layer can be successfully reduced to about 700° C. or less by using a ECR-MBE method. This eliminates the decomposition or vaporization of the ZnO buffer layer. Accordingly, it is possible to form a GaN layer having a high-quality crystallinity due to the existence of the true ZnO buffer layer.

Second Embodiment

Figure 5:
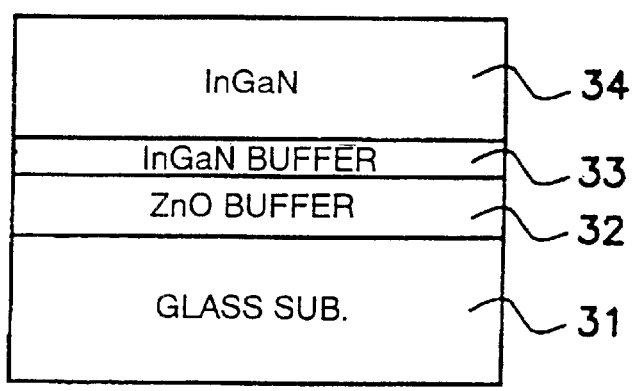
FIG. 5 is a cross-sectional view of an InGaN layer grown a by a method according to a second embodiment of the present invention.

In this embodiment, as shown in FIG. 5, an InGaN layer is epitaxially grown on a glass substrate by using the ECR-MBE apparatus 1 described above. The following describes a substrate, materials, and a procedure which are used in this embodiment.

In this embodiment, the materials used for depositing an InGaN layer are a metal Ga of a purity 8N (99.999999%) as a Group III material and another metal In of the same purity as the In metal. Other materials and the substrate used in this embodiment are the same as for the first embodiment.

Regarding a deposition procedure, the deposition conditions for an InGaN buffer layer 33 depositing being deposited at a low temperature and those for an InGaN layer 34 are respectively set to those shown in Table 3. Other conditions are the same as in the first embodiment.

TABLE 3

| | Substrate Temp. | Ga Cell Temp. | In cell Temp. | Nitrogen Flow Rate | Microwave Power | Substrate Bias |
|---|---|---|---|---|---|---|
| Buffer Layer | 450° C. | 850° C. | 640° C. | 30 sccm | 80 W | +18 V |
| InGaN Layer | 680° C. | 860° C. | 640° C. | 30 sccm | 120 W | +20 V |

As a result of carrying out the aforementioned procedure, the InGaN layer 5 is epitaxially grown on the glass substrate 31. A time chart of this deposition procedure for the GaN layer is shown in FIG. 3. In the series of deposition steps of this embodiment as well, the substrate temperature can be maintained at 700° C. or lower.

Figure 6:
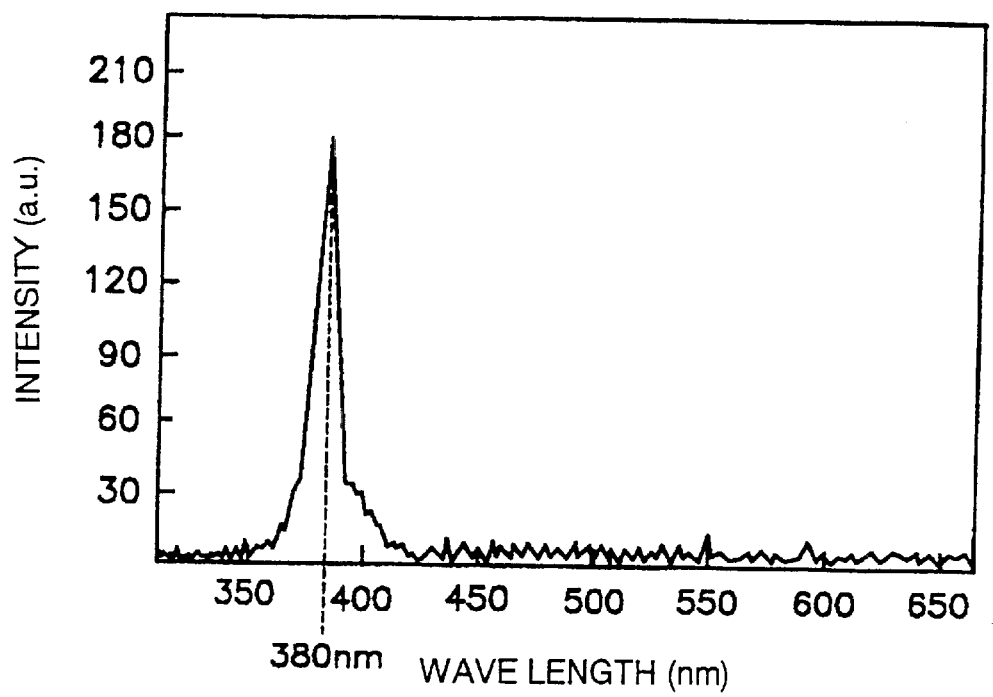
FIG. 6 is a graph showing the photoluminescence spectrum obtained from the InGaN layer according to the second embodiment of the present invention.

The optical properties of the InGaN layer produced in the above steps are shown in FIG. 6. As an optical-property evaluation method, the same method as in the first embodiment is used. As can be seen from this figure, for the InGaN layer produced in this embodiment, an emission spectrum can be confirmed mainly in the vicinity of a band end (380 nm).

Third embodiment

FIG. 4 shows a schematic cross-sectional view of a semiconductor light emitting device 40. The semiconductor light emitting device comprises a glass substrate 41, a ZnO buffer layer 42 provided on the glass substrate 41 and a semiconductor structure 50 provided on the ZnO buffer layer 42. The semiconductor structure 50 includes an n-GaN cladding layer 44, a p-GaN cladding layer 46 and an InGaN active layer 45 stacked between the n-GaN cladding layer 44 and the p-GaN cladding layer 46. The semiconductor structure 50 further includes a GaN buffer layer 42 so as to be interposed between the n-GaN cladding layer 44 and the ZnO buffer layer 42. An n-type electrode 47 is formed on a side surfaces of the n-GaN cladding layer 44, the n-GaN cladding layer 44 and the and the ZnO buffer layer 42. A p-type electrode 48 is formed on the top surface of the p-GaN cladding layer 46.

The semiconductor structure 50 is formed on ZnO buffer layer 42 in the same way as explained in the first and second embodiments using Zn metal, Mg metal and Si as sources for doping materials. More specifically, the non-doped amorphous GaN buffer layer 42 having a thickness of 0.02 $\mu$m is first formed on the ZnO buffer layer 42. Then the Si-doped n-GaN cladding layer 44 having a thickness of 3 $\mu$m and an impurity concentration of $1 \times 10^{18}$ cm$^{-3}$, the Zn-doped InGaN active layer 44 having a thickness of 0.01 $\mu$m and an impurity concentration of $1 \times 10^{20}$ cm$^{-3}$ and the Mg-doped p-GaN cladding layer 46 having a thickness of 0.8 $\mu$m and an impurity concentration of $1 \times 10^{17}$ cm$^{-3}$ are successively formed on the GaN buffer layer 42.

According to this embodiment, the semiconductor structure 50 having an excellent crystallinity can be formed at a temperature of 700° C. or less on the glass substrate 41. Therefore, the semiconductor light emitting device 40 can emit blue light without suffering from the problems associated with the conventional art.

Other Embodiments

Figure 7:
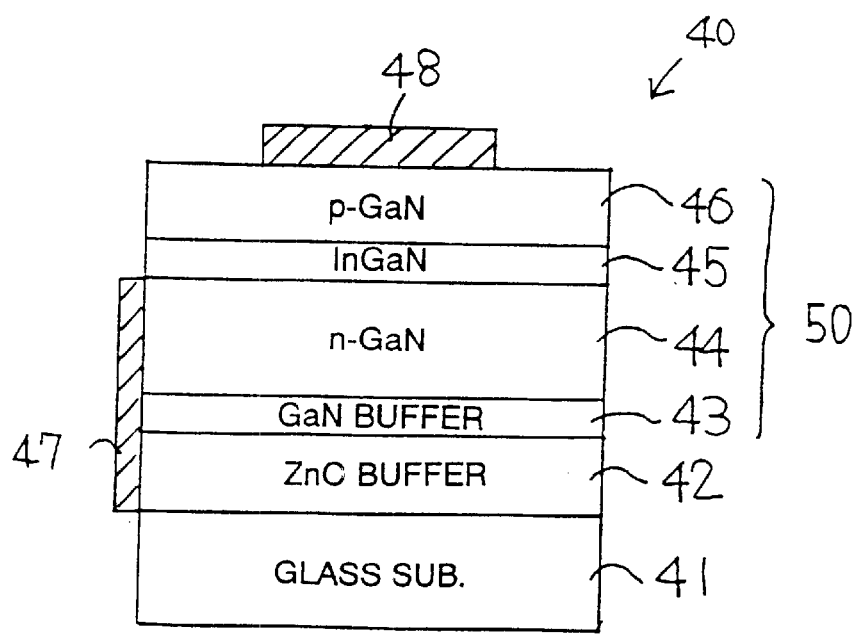
FIG. 7 is a schematic cross-sectional view illustrating a semiconductor light emitting device according to a third embodiment of the present invention.
Figure 8A:
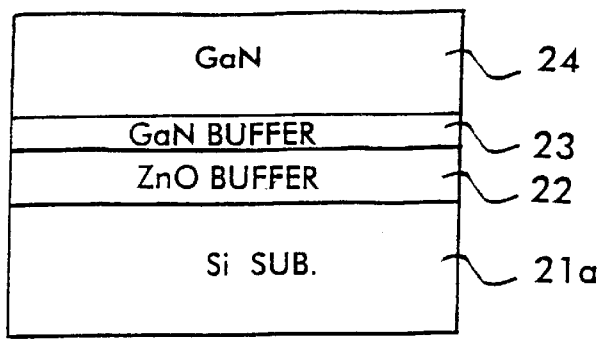
FIGS. 8A, 8B and 8C are schematic cross-sectional views illustrating light emitting devices according to variations of the first, second and third embodiments of the present invention.
Figure 8B:
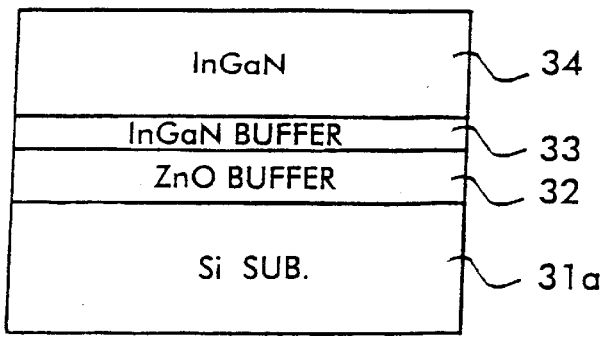
Figure 8C:
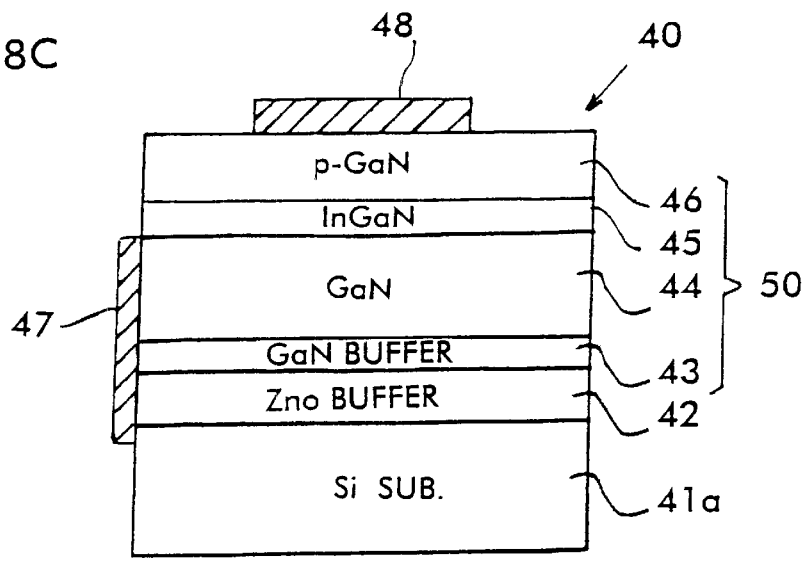

It is a matter of course that the present invention is not limited to the deposition conditions described in the aforementioned embodiments and it is variable within an intended range described herein. For example, in the embodiments described above, a borosilicate glass substrate is used, but, so as not to be limited to this, other silicon substrates, which are also low-priced substrates, can be used, as shown in FIGS. 8A, 8B and 8C, which corresponds respectively to FIGS. 2, 5 and 7, except for the use of silicon substrates 21a, 31a and 41a rather than the glass substrates 21, 31 and 41. In this case, other IC parts can be formed on the same substrate on which a GaN layer is deposited.

In the aforementioned embodiments, the GaN-based layer is formed at about 680° C. The GaN-based layer, however, may be formed at a temperature in the range of about 400 to 500° C. so as to further improve the crystallinity. In the case, the glass substrate having a softening point of less than 700° C. can be employed. On the other hand, in the case where a silicon substrate is used, a GaN-based layer may be formed at a temperature of 850° C. or less as a silicon substrate does not melt or deform at the temperature.

In addition, although formations of the GaN layer and the InGaN layer and a semiconductor light emitting device having the GaN layer and the InGaN layer are explained as embodiments of the present invention, it is well understood that the present invention can be applied to a formation of layer of $Ga_{1-x}In_xN$, $Ga_{1-x}Al_xN$, $Ga_{1-x}B_xN$ and mixed crystal thereof, i.e., GaN-based materials.

Further, although the semiconductor light emitting device according to the third embodiment has a double heterostructure, the semiconductor light emitting device may be has a single heterostructure or a homostructure and has a light emitting diode structure or a laser structure as long as the semiconductor light emitting device includes a GaN-based layer which emits a light in the region from blue to violet, as a light emitting layer.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor light emitting device comprising:
   a glass substrate having a softening point of 800° C. or less;
   a ZnO buffer layer provided on the glass substrate; and
   a semiconductor structure including at least one light emitting layer made of a GaN-based semiconductor.

2. The semiconductor light emitting device according to claim 1, wherein the light emitting layer is formed by using an electron cyclotron resonance-molecular beam epitaxy (ECR-MBE) method.

3. A The semiconductor light emitting device according to claim 1, further comprising an amorphous GaN-based semiconductor buffer layer between the ZnO buffer layer and the light emitting layer.

4. The semiconductor light emitting device according to claim 1, wherein the light emitting layer is made of GaN semiconductor.

5. The semiconductor light emitting device according to claim 1, wherein the light emitting layer is made of InGaN semiconductor.

* * * * *